(12) United States Patent
Kowatari

(10) Patent No.: US 7,401,306 B2
(45) Date of Patent: Jul. 15, 2008

(54) APPARATUS AND METHOD FOR VERIFICATION SUPPORT, AND COMPUTER PRODUCT

(75) Inventor: Satoshi Kowatari, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 195 days.

(21) Appl. No.: 11/253,615

(22) Filed: Oct. 20, 2005

(65) Prior Publication Data

US 2006/0206846 A1 Sep. 14, 2006

(30) Foreign Application Priority Data

Mar. 14, 2005 (JP) ............................. 2005-071273

(51) Int. Cl.
*G06F 17/50* (2006.01)
*G06F 9/45* (2006.01)

(52) U.S. Cl. .................. 716/5; 716/6; 327/39; 327/47; 714/731; 714/744

(58) Field of Classification Search ................. 716/4–6; 327/39–47, 141, 144, 145; 714/724, 726, 714/731, 744

See application file for complete search history.

(56) References Cited

U.S. PATENT DOCUMENTS

| 5,700,753 | A | * | 12/1997 | Wang et al. | ................. | 502/330 |
| 5,793,227 | A | * | 8/1998 | Goldrian | ...................... | 326/94 |
| 6,510,535 | B1 | * | 1/2003 | Hosokawa et al. | .......... | 714/726 |
| 2005/0268265 | A1 | * | 12/2005 | Ly et al. | ........................ | 716/6 |
| 2005/0273735 | A1 | * | 12/2005 | Dargelas | ........................ | 716/4 |

FOREIGN PATENT DOCUMENTS

| JP | 6-83901 | 3/1994 |
| JP | 10-117185 | 5/1998 |

* cited by examiner

*Primary Examiner*—Thuan Do
*Assistant Examiner*—Nghia M Doan
(74) *Attorney, Agent, or Firm*—Staas & Halsey LLP

(57) ABSTRACT

A verification support apparatus verifies an object. The object includes a plurality of clock domains and each clock domain includes a plurality of registers. The verification support apparatus includes an input receiving unit that receives logical circuit description information on the object; a specifying unit that specifies at least two registers in one clock domain that output data to an adjacent clock domain; and a detecting unit that detects, based on the logical circuit description information and specified registers, a re-convergence register in the adjacent clock domain that achieves convergence.

12 Claims, 11 Drawing Sheets

APPARATUS AND METHOD FOR VERIFICATION SUPPORT, AND COMPUTER PRODUCT

CROSS-REFERENCE TO RELATED APPLICATIONS

This application is based upon and claims the benefit of priority from the prior Japanese Patent Application No. 2005-071273, filed on Mar. 14, 2005, the entire contents of which are incorporated herein by reference.

BACKGROUND OF THE INVENTION

1. Field of the Invention

The present invention relates to an apparatus and a method for verification support, and a computer product for creating verification properties used in verifying various objects, in LSI design.

2. Description of the Related Art

In the field of LSI design, while there have been demands to increase work efficiency by shortening design time, it is essential to have a verification process for verifying if each LSI works properly. Especially, because there are demands for LSIs that are large in scale, have sophisticated functions, have a high speed, and consume less electricity, it is important to have such a verification process to maintain high quality of the LSIs.

An LSI includes an asynchronous multi-clock logical circuit driven by two or more clocks with mutually different cycles. The asynchronous multi-clock logical circuit may experience a problem when data is transferred from a circuit driven by one clock to another circuit driven by another clock; in other words, when data is transferred over a border between two clock domains, due to disturbance in the value transfer caused by metastability. More specifically, the problem occurs because the value is transferred from one clock domain to another clock domain either one cycle later or one cycle earlier.

Japanese Unexamined Patent Application Publication No. H6-83901 and Japanese Unexamined Patent Application Publication No. H10-117185 disclose a verification process in which metastability is introduced in a logical circuit in a simulation or static verification environment, and it is checked whether verification properties for normal verification (i.e. no occurrence of metastability) are violated.

According to the conventional technique described above, although there are a large number of clock domains in an asynchronous multi-clock logical circuit, designers try to find manually in the clock domains, locations at which problems have been caused by metastability. Designers are also expected to analyze what types of verification processes are effective, because even if some locations have problems caused by metastability, there is no apparent change in the external ports, or sometimes the change is masked by other signals. Accordingly, there have been problems that the burden on the designers is more, the designing labor increases, and the designing period is long.

SUMMARY OF THE INVENTION

It is an object of the present invention to at least solve the problems in the conventional technology.

According to one aspect of the present invention, a verification support apparatus that verifies an object, the object including a plurality of clock domains, each clock domain including a plurality of registers, includes an input receiving unit that receives logical circuit description information on the object; a specifying unit that specifies at least two registers in one clock domain that output data to an adjacent clock domain; and a detecting unit that detects, based on the logical circuit description information and specified registers, a re-convergence register in the adjacent clock domain that achieves convergence.

According to another aspect of the present invention, a method that verifies an object, the object including a plurality of clock domains, each clock domain including a plurality of registers, includes receiving logical circuit description information on the object; specifying at least two registers in one clock domain that output data to an adjacent clock domain; and detecting, based on the logical circuit description information and specified registers, a re-convergence register in the adjacent clock domain that achieves convergence.

According to still another aspect of the present invention, a computer readable recording medium records thereon a computer program including instructions which, when executed, cause a computer to execute a method according to the present invention.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention are explained in detail below with reference to the accompanying drawings.

Figure 1:
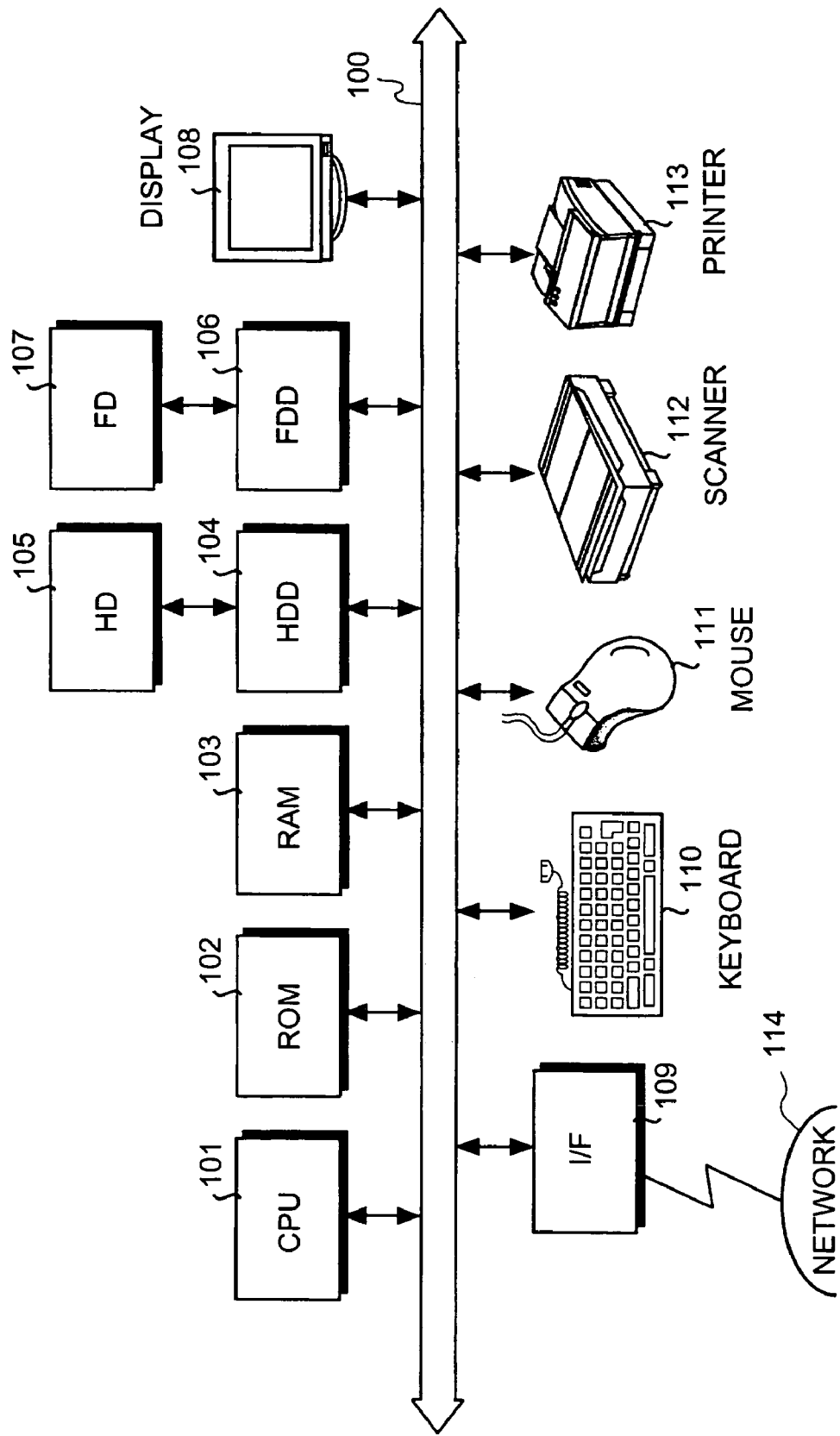
FIG. 1 is a block diagram of a verification support apparatus.

FIG. 1 is a block diagram of a verification support apparatus according to the present invention.

As shown in FIG. 1, the verification support apparatus includes a CPU 101, a ROM 102, a RAM 103, an HDD (hard disk drive) 104, an HD (hard disk) 105, an FDD (flexible disk drive) 106, an FD (flexible disk) 107 that serves as an example of a removable recording medium, a display 108, an I/F (interface) 109, a keyboard 110, a mouse 111, a scanner 112, and a printer 113. These constituent elements are connected with one another via a bus 100.

The CPU 101 exercises the overall control of the verification support apparatus. The ROM 102 stores therein programs including a boot program. The RAM 103 is used as a work area of the CPU 101. The HDD 104 controls reading/writing data from and to the HD 105, according to the control by the CPU 101. The HD 105 stores therein data written under the control of the HDD 104.

The FDD 106 controls reading/writing data from and to the FD 107, according to the control by the CPU 101. The FD 107 stores therein data written under the control of the FDD 106, and also allows the verification support apparatus to read data stored in the FD 107.

Instead of the FD 107, other forms of removable recording medium such as a CD-ROM (CD-R, CD-RW), an MO, a DVD (a Digital Versatile Disk), or a memory card may be used. The display 108 displays data for documents, images, and functional information such as a cursor, icons, and toolboxes. The display 108 may be a CRT, a TFT liquid crystal display, a plasma display, or the like.

The I/F 109 is connected to a network 114 such as the Internet via a communication line, and is connected with other apparatuses via the network 114. The I/F 109 governs the network 114 and an internal interface and controls input and output of data to and from external apparatuses. The I/F 109 may be a modem, a LAN adapter, or the like.

The keyboard 110 has keys for inputting characters, numerals, and other various instructions, and is used for data input. The keyboard 110 may be a touch-panel input pad or ten-keys. The mouse 111 is used for moving a cursor, selecting fields, moving windows, changing sizes of windows, and the like. A track pole or a joystick may be used as an alternative to the mouse 111, as long as similar functions of a pointing device are provided.

The scanner 112 optically reads images and scans image data into the verification support apparatus. The scanner 112 may have an OCR function. The printer 113 prints out image data and document data. The printer 113 may be a laser printer or an inkjet printer.

Figure 2:
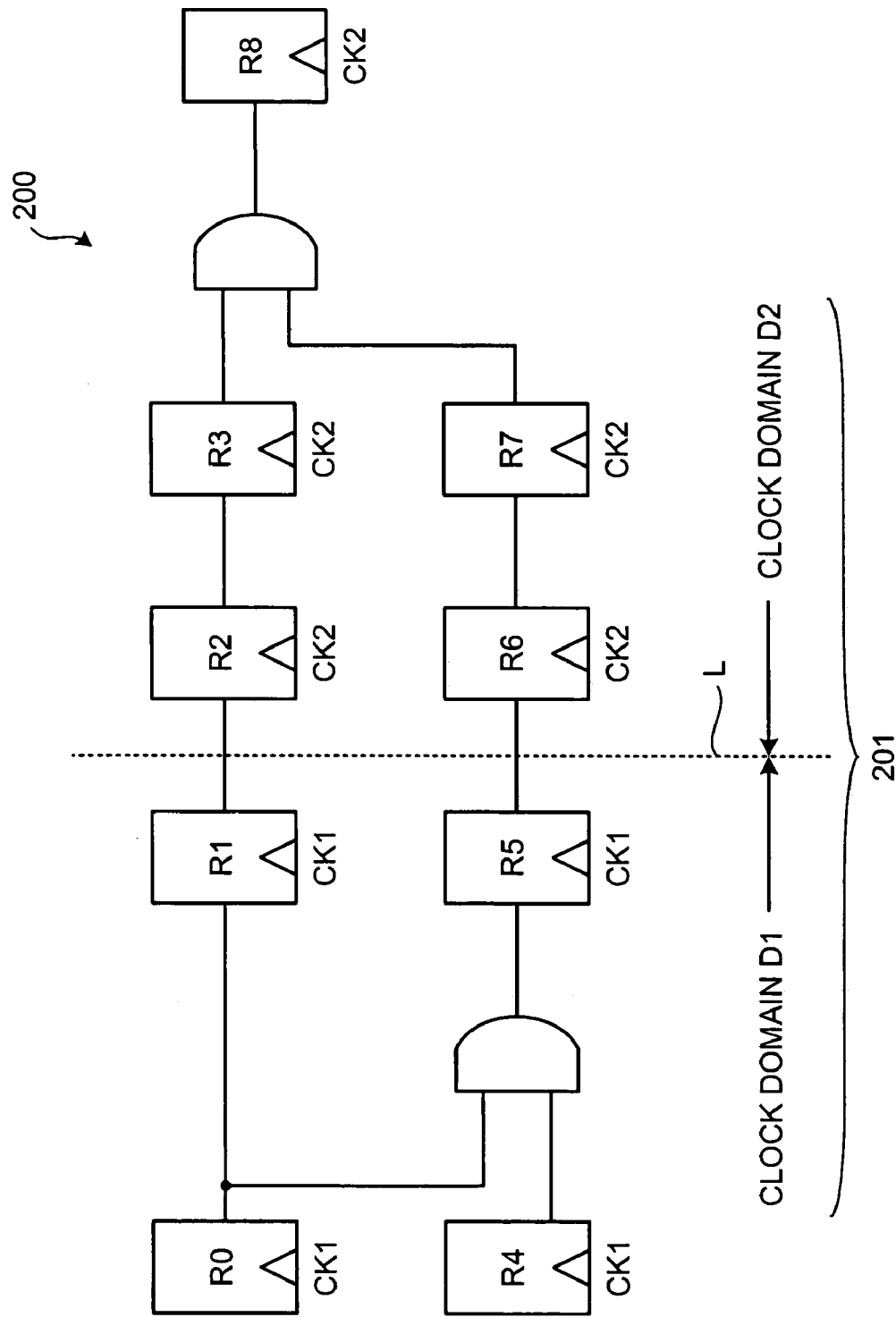
FIG. 2 is a circuit diagram of an example of a verification object.

FIG. 2 is a circuit diagram of an example of a verification object. As shown in FIG. 2, a verification object 200 is an asynchronous multi-clock logical circuit that includes a clock domain 201, which is made up of a clock domain D1 and a clock domain D2. In the verification object 200, data flows from the clock domain D1 to the clock domain D2. In FIG. 2, the border L in the clock domain 201 is a position at which the clock CK1 is switched to the clock CK2, and is shown with a dotted line.

The clock domain D1 includes a group of logical circuits that are each driven by the clock CK1, and includes registers R0, R1, R4, and R5. The clock domain D2 includes a group of logical circuits that are each driven by the clock CK2, and includes registers R2, R3, R6, R7, and R8. The clock domain 201 may be arranged in advance based on operational inputs given by a designer, or based on analysis results from an analysis tool, which is not shown in the drawing.

Figure 3:
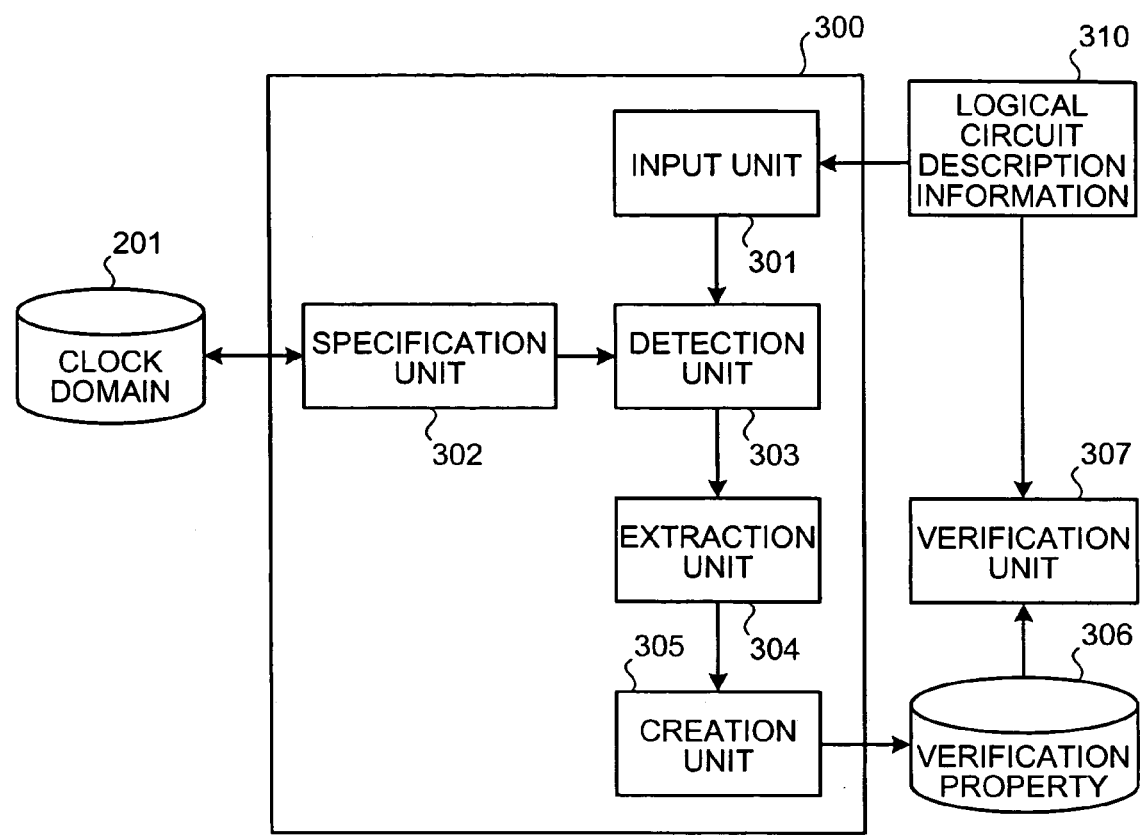
FIG. 3 is a functional block diagram of the verification support apparatus.

FIG. 3 is a functional block diagram of a verification support apparatus according to an embodiment of the present invention. As shown in FIG. 3, a verification support apparatus 300 includes an input unit 301, a specification unit 302, a detection unit 303, an extraction unit 304, and a creation unit 305.

The input unit 301 receives an input of logical circuit description information 310 of the verification object 200. The logical circuit description information 310 indicates logical circuit description of the verification object 200 shown in FIG. 2, and is, for example, circuit information written in a netlist or an RTL HDL.

The specification unit 302 specifies two or more registers. Each register outputs data from one of a pair of adjacent clock domains within the clock domain 201 in the verification object 200. To explain more specifically with reference to FIG. 2, the clock domain D1 is one of the pair of adjacent clock domains D1 and D2. The specification unit 302 specifies the registers R1 and R5, each of which outputs data from the clock domain D1. The registers R1 and R5 specified in this manner will be referred to as "clock domain registers".

The detection unit 303 detects a single register (hereinafter, "re-convergence register") that achieves convergence in the other of the pair of clock domains, i.e. the clock domain D2, based on the logical circuit description information 310 of the verification object 200 that is inputted by the input unit 301, and the two or more registers that have been specified by the specification unit 302. More specifically, the detection unit 303 detects the re-convergence register that achieves convergence in the other clock domain, i.e. the clock domain D2, by following the logic on the fan-out side from the two or more registers. In other words, in the example of the aforementioned verification object 200 shown in FIG. 2, the detection unit 303 detects the register R8 achieving convergence in the clock domain D2 as the re-convergence register, by following the logic on the fan-out side form the registers R1 and R5 specified by the specification unit 302.

Figure 4:
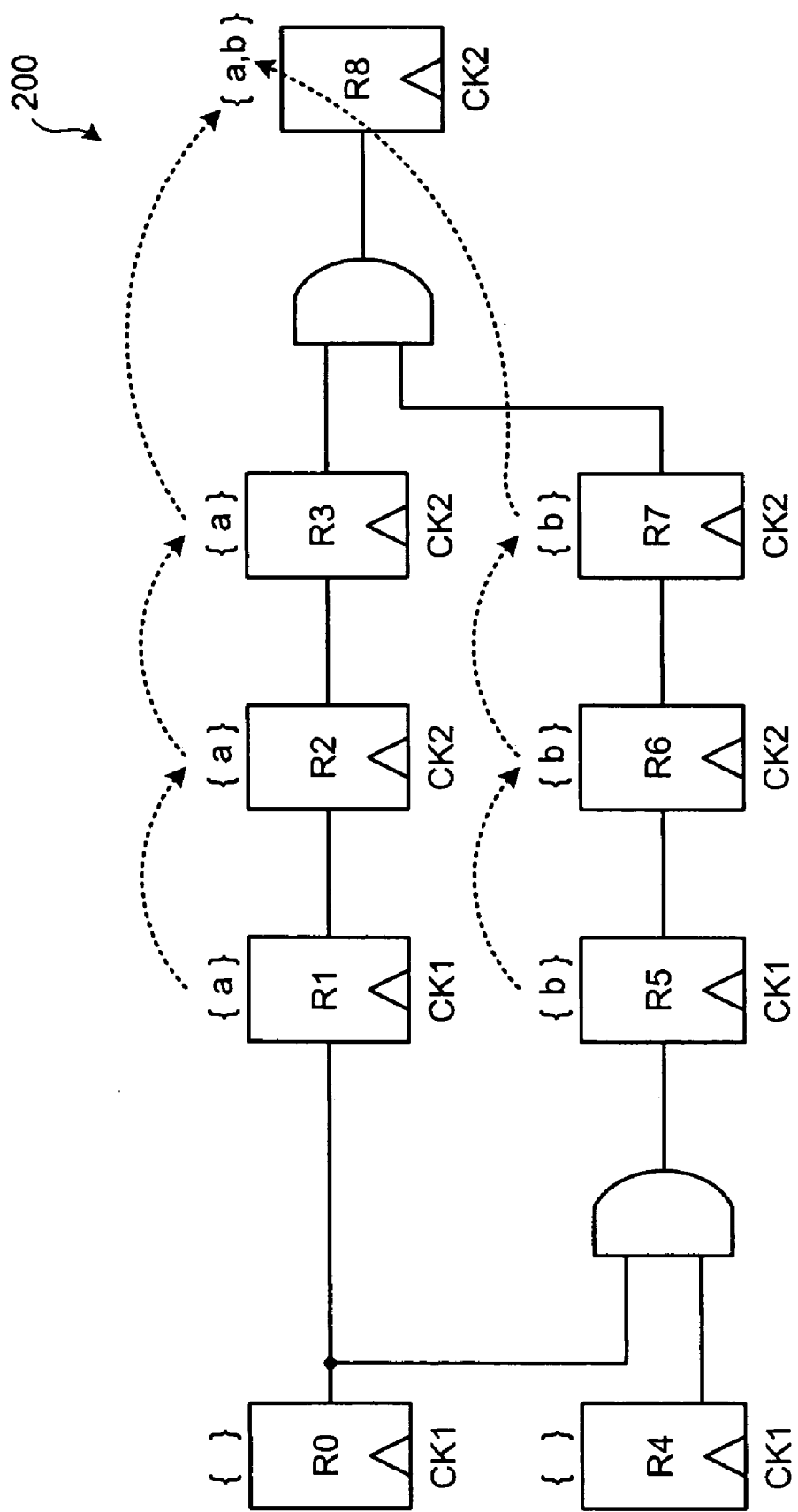
FIG. 4 is a circuit diagram of a verification object on which a re-convergence register detection process is performed.

Next, the detection process performed by the detection unit 303 is described more specifically. FIG. 4 is a circuit diagram of the verification object 200 on which a re-convergence register detection process is performed. In FIG. 4, labels {a} and {b} are assigned to the clock domain registers, i.e. the registers R1 and R5, respectively. The circuit fans out as shown with arrows with dotted lines, and the same labels are respectively assigned to the registers at the fan-out destinations (hereinafter, "fan-out registers").

For example, when the logic is followed on the fan-out side from the register R1 to the register R2, the label {a} assigned to the register R1 is assigned to the fan-out register R2. When the logic is followed on the fan-out side from the register R2, the label {a} assigned to the register R2 is assigned to the fan-out register R3. The fan-outs continue in this manner, and finally the register R8 to which the labels {a} and {b} are assigned is taken as a re-convergence register. With this arrangement, it is possible to automatically detect a register that is likely to be metastable.

Referring to FIG. 3, the extraction unit 304 extracts the logic up to two or more registers (hereinafter, "re-convergence logic") from the re-convergence register detected by the detection unit 303. More specifically, the extraction unit 304 extracts the re-convergence logic that is formed by registers at fan-in destinations (hereinafter, "fan-in registers") and the re-convergence register, by following the logic on the fan-in side, from the re-convergence register to the two or more registers.

Figure 5:
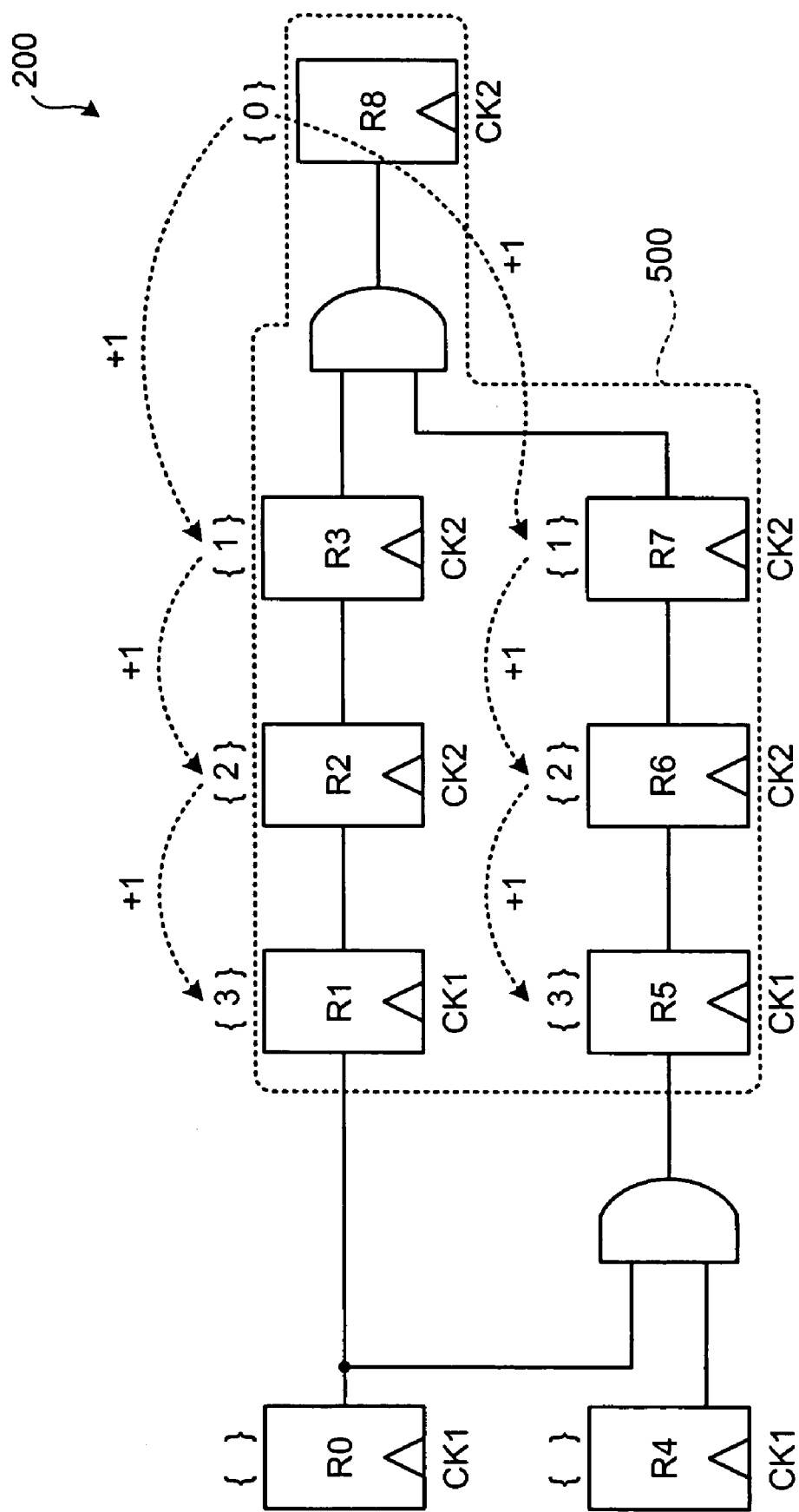
FIG. 5 is a circuit diagram of a verification object on which a re-convergence logic extraction process is performed.

Next, the extraction process performed by the extraction unit 304 is described more specifically. FIG. 5 is a circuit diagram of the verification object 200, on which a re-convergence logic extraction process is performed. As shown in FIG. 5, a reaching cycle number C of the re-convergence register, i.e. the register R8, is transferred from the re-convergence register (i.e. the register R8) to the fan-in registers (the registers R1 to R3 and R5 to R7).

More specifically, for the aforementioned verification object 200 shown in FIG. 2, the extraction unit 304 extracts a re-convergence logic 500 that is formed by the fan-in registers (the registers R1 to R3 and R5 to R7) and the re-convergence register (the register R8), by following the logic on the fan-in side from the re-convergence register (i.e. the register R8) to the clock domain registers (the registers R1 and R5).

For example, in a case where the reaching cycle number C of the re-convergence register (i.e. the register R8) is {0}, the reaching cycle number C of each of the fan-in registers R3 and R7 is {1}, whereas the reaching cycle number C of each of the registers R2 and R6 is {2}, and the reaching cycle number C of each of the registers R1 and RS is {3}. The transfer of the reaching cycle numbers C is terminated at the clock domain registers (i.e. the registers R1 and R5).

The logical circuit that includes the fan-in registers (i.e. the registers R1 to R3 and R5 to R7) to which the reaching cycle number C has been transferred and the re-convergence register (i.e. the register R8) is extracted as the re-convergence logic 500. Consequently, it is understood that the registers R0 and R4 are not necessary in verification of the re-convergence register (i.e. the register R8). In other words, it is possible to obtain a circuit necessary for verification of the re-convergence register (i.e. the register R8), as well as the reaching cycle number C of the re-convergence register (i.e. the register R8).

Referring to FIG. 3, the creation unit 305 creates a verification property 306 for verifying the verification object 200, based on the re-convergence logic extracted by the extraction unit 304. More specifically, the creation unit 305 creates the verification property 306 for verifying the verification object 200 using the reaching cycle number appended to each of the fan-in registers based on the re-convergence logic extracted by the extraction unit 304.

More specifically, based on the re-convergence logic, the creation unit 305 creates a logic by which the value of the re-convergence register becomes 1 (or 0). The logical variables of the registers constituting the re-convergence logic are created based on their reaching cycle numbers.

<logical variable>::=prev(<register name>, <reaching cycle number>)   (1)

Further, the creation unit 305 connects a logical formula for allowing the re-convergence register to be 1 (or 0) serving as an antecedent, and the logical formula (1) described above serving as a consequent with a conditional operator, to thereby create the verification property 306 as shown below using a property language, for example, a hardware description language such as Verilog-HDL.

always((re-convergence register=1)-><logical formula for the value to be 1>)   (2)

always((re-convergence register=0)-><logical formula for the value to be 0>)   (3)

Next, the verification property creation process performed by the creation unit 305 is described more specifically with reference to the re-convergence logic 500, which is described above and shown in FIG. 5. The creation unit 305 sets the logical variables of the registers R1 to R3 and R5 to R7 that constitute the re-convergence logic 500, based on their reaching cycle numbers C, using the logical formula (1) described above.

The logical variable for the register $R1 \Rightarrow \text{prev}(R1, 3)$   (4)

The logical variable for the register $R5 \Rightarrow \text{prev}(R5, 3)$   (5)

The logical variable for the register $R2 \Rightarrow \text{prev}(R2, 2)$   (6)

The logical variable for the register $R6 \Rightarrow \text{prev}(R6, 2)$   (7)

The logical variable for the register $R3 \Rightarrow \text{prev}(R3, 1)$   (8)

The logical variable for the register $R7 \Rightarrow \text{prev}(R7, 1)$   (9)

The logical variable in the formula (4) indicates the value in the register R1, which is positioned 3 cycles before the re-convergence register (i.e. the register R8). The logical variable in the formula (5) indicates the value in the register R5, which is positioned 3 cycles before the re-convergence register (i.e. the register R8). The logical variable in the formula (6) indicates the value in the register R2, which is positioned 2 cycles before the re-convergence register (i.e. the register R8). The logical variable in the formula (7) indicates the value in the register R6, which is positioned 2 cycles before the re-convergence register (i.e. the register R8). The logical variable in the formula (8) indicates the value in the register R3, which is positioned 1 cycle before the re-convergence register (i.e. the register R8). The logical variable in the formula (9) indicates the value in the register R7, which is positioned 1 cycle before the re-convergence register (i.e. the register R8).

Using the logical variables in the formulae (4) to (9), the logical formulae (10) to (15) shown below, related to the re-convergence register (i.e. the register R8), are created using an HDL (e.g. Verilog-HDL).

$R8=(\text{prev}(R3, 1) \&\& \text{prev}(R7, 1))$   (10)

$\text{prev}(R3, 1)=\text{prev}(R2, 2)$   (11)

$\text{prev}(R2, 2)=\text{prev}(R1, 3)$   (12)

$\text{prev}(R7, 1)=\text{prev}(R6, 2)$   (13)

$\text{prev}(R6, 2)=\text{prev}(R5, 3)$   (14)

$!R8=(!\text{prev}(R3, 1) \mid\mid !\text{prev}(R7, 1))$   (15)

Figure 6:
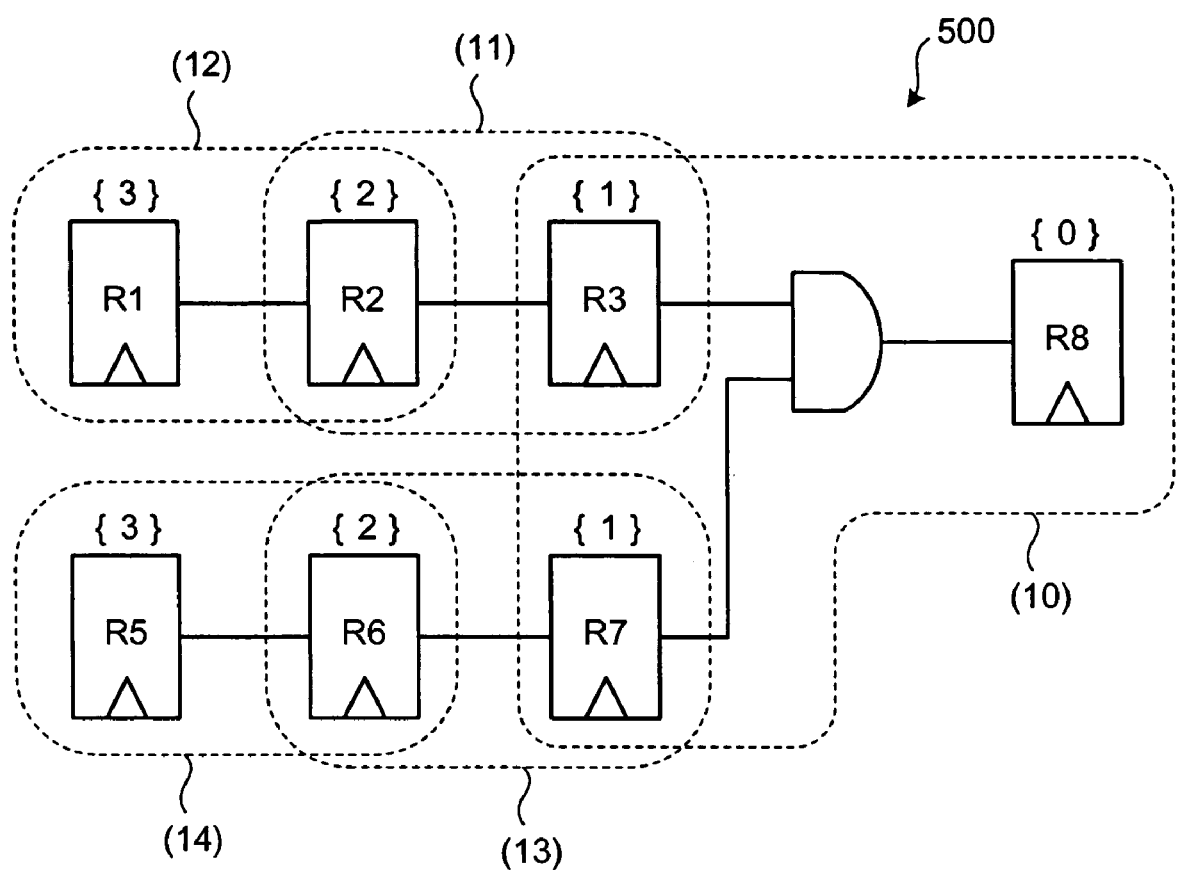
FIG. 6 is a circuit diagram of a re-convergence logic showing relationship with logical formulae (10) to (14)

FIG. 6 illustrates the portions that correspond to the logical formulae (10) to (14). FIG. 6 is a circuit diagram of the re-convergence logic 500 that shows the corresponding relationship with the logical formulae (10) to (14). Further, when the logical formulae (10) and (15) above are expanded using the logical formulae (11) to (14), the logical formulae (16) and (17) shown below are obtained.

$R8=(\text{prev}(R1, 3) \&\& \text{prev}(R5, 3))$   (16)

$!R8=(!\text{prev}(R1, 3) \mid\mid !\text{prev}(R5, 3))$   (17)

Finally, the verification property 306 for verifying the re-convergence register (i.e. the register R8) is created using the logical formulae (16) and (17) shown above. For example, when description is made in a verification property language PSL, the verification property 306 is obtained as shown below in (18) and (19): The verification property 306 for checking if the value of R8 is obtained correctly as 1:

assert always $(R8\text{->}(\text{prev}(R1, 3) \&\& \text{prev}(R5, 3) @ (\text{posedge } CK2);$   (18)

The verification property 306 for checking if the value of R8 is obtained correctly as 0:

assert always $(!R8\text{->}(!\text{prev}(R1, 3) \mid\mid !\text{prev}(R5, 3)) @ (\text{posedge } CK2);$   (19)

Figure 7:
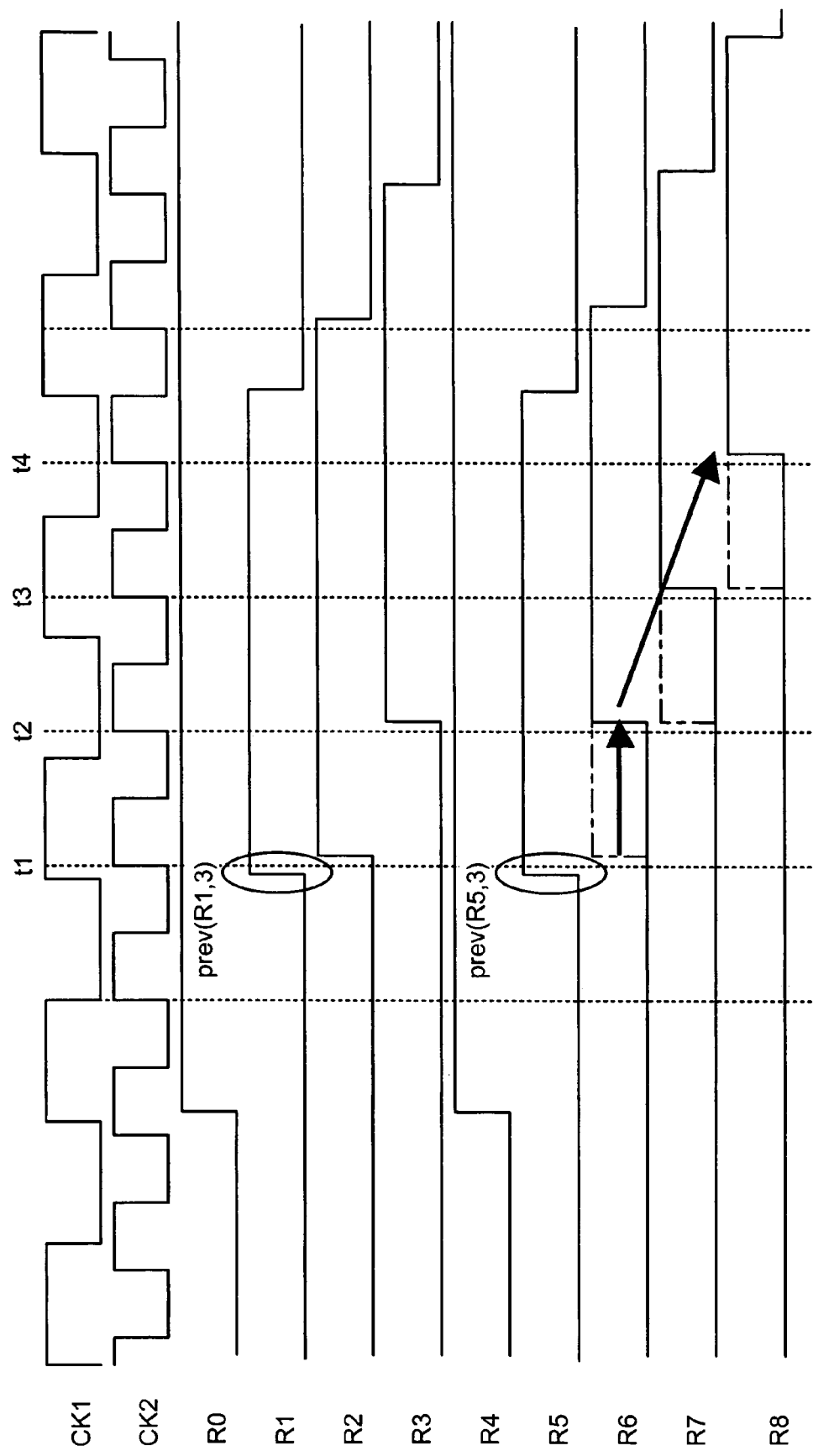
FIG. 7 is a timing chart of a verification process performed by a verification unit.

A verification unit 307 is a so-called general verification tool, and executes a verification process when the logical circuit description information 310 and the verification property 306 are inputted thereto. FIG. 7 is a timing chart of a verification process performed by the verification unit 307. FIG. 7 is based on a premise that the register R5 is metastable.

In the verification object 200 shown in FIG. 2, in a normal situation, the values of the registers R6 to R8 should be as shown with dashed lines during the period between t1 to t4; however, there is a delay of one cycle due to the metastability of the register R5. Because of the delays, the value of the register R8 is "0" at the time t4. However, because prev(R1, 3) and prev(R5, 3) are "1" at the time t1, which is 3 cycles before the time t4, the verification property 306 calculated by (18) is violated.

Figure 8:
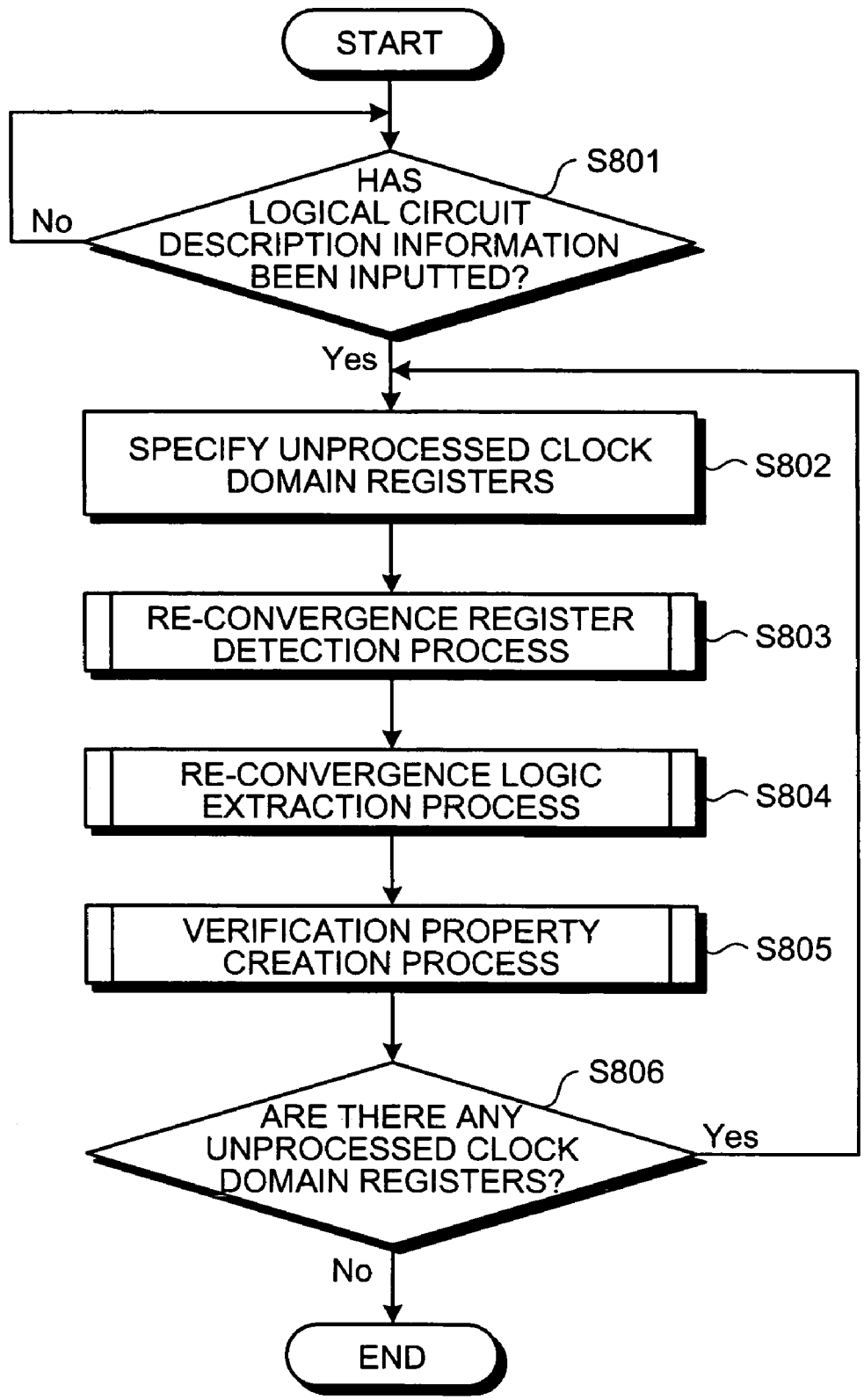
FIG. 8 is a flowchart of a verification support process procedure.

FIG. 8 is a flowchart of a verification support process procedure. In FIG. 8, if the logical circuit description information 310 has been inputted (Yes at step S801), unprocessed clock domain registers are specified (step S802). For example, the registers R1 and R5, which are the clock domain registers, are specified, as shown in FIG. 2.

Subsequently, the re-convergence register detection process (step S803), the re-convergence logic extraction process (step S804), and the verification property creation process (step S805) are performed. Then, if there is any unprocessed clock domain register (Yes at step S806), the procedure returns to step S802, where the unprocessed clock domain registers are specified. On the other hand, if there are no unprocessed clock domain registers (No at step S806), then the verification support process ends.

Figure 9:
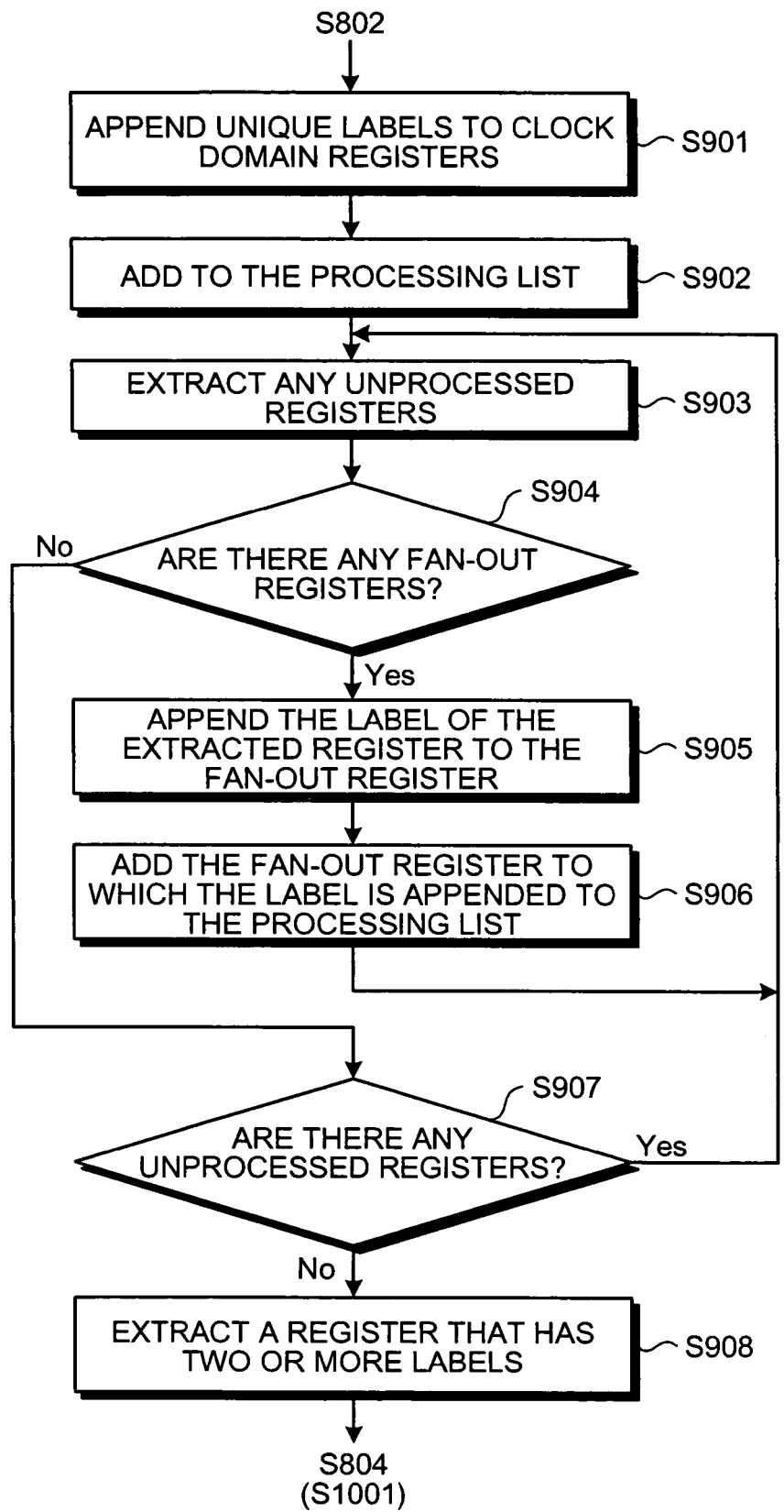
FIG. 9 is a flowchart of a re-convergence register detection process illustrated in FIG. 8.

FIG. 9 is a flowchart of the re-convergence register detection process illustrated in FIG. 8. As shown in FIG. 9, unique labels appended to the clock domain registers (step S901). For example, a label {a} and a label {b} are appended respectively to the registers R1 and R5, which have been specified as the clock domain registers.

These clock domain registers with the labels are added to a processing list within the detection unit 303 (step S902). Subsequently, unprocessed registers are extracted from the processing list (step S903), and it is judged whether the extracted registers include any fan-out registers (step S904). If a fan-out register is included (Yes at step S904), the label appended to the extracted register is appended to the fan-out register (step S905), and the fan-out register with the label is added to the processing list (step S906). The procedure then returns to step S903.

For example, suppose that the register extracted at step S903 is the register R3 to which a label {a} is appended. Because a fan-out register R8 exists, a label {a} is appended to the register R8, and the register R8 with the label is added to the processing list. Consequently, the register R3 in the processing list is updated with the register R8 to which a label {a} is appended.

As another example, suppose that the register extracted at step S903 is the register R7 to which a label {b} is appended. Because a fan-out register R8 having a label {a} exists, another label {b} is appended to the register R8, and the register R8 with the labels is added to the processing list. Consequently, the register R3 in the processing list is updated with the register R8 to which the label {b} is appended. As a result, two or more labels, {a} and {b}, are appended to the register R8.

If no fan-out registers exist at step S904 (No at step S904), it is judged whether the processing list includes any unprocessed registers (step S907). If there are any unprocessed registers (Yes at step S907), the procedure returns to step S903, where the unprocessed registers are extracted. On the other hand, if there are no unprocessed registers (No at step S907), a register having two or more labels within the processing list is extracted (step S908).

For example, if the register extracted at step S903 is the register R8 to which a label {a} is appended, there is no fan-out register. Also, in the case where the register extracted at step S903 is the register R8 to which a label {b} is appended, there is no fan-out register. Consequently, the register R8 is extracted as a re-convergence register to which two or more labels, {a} and {b}, are appended.

Figure 10:
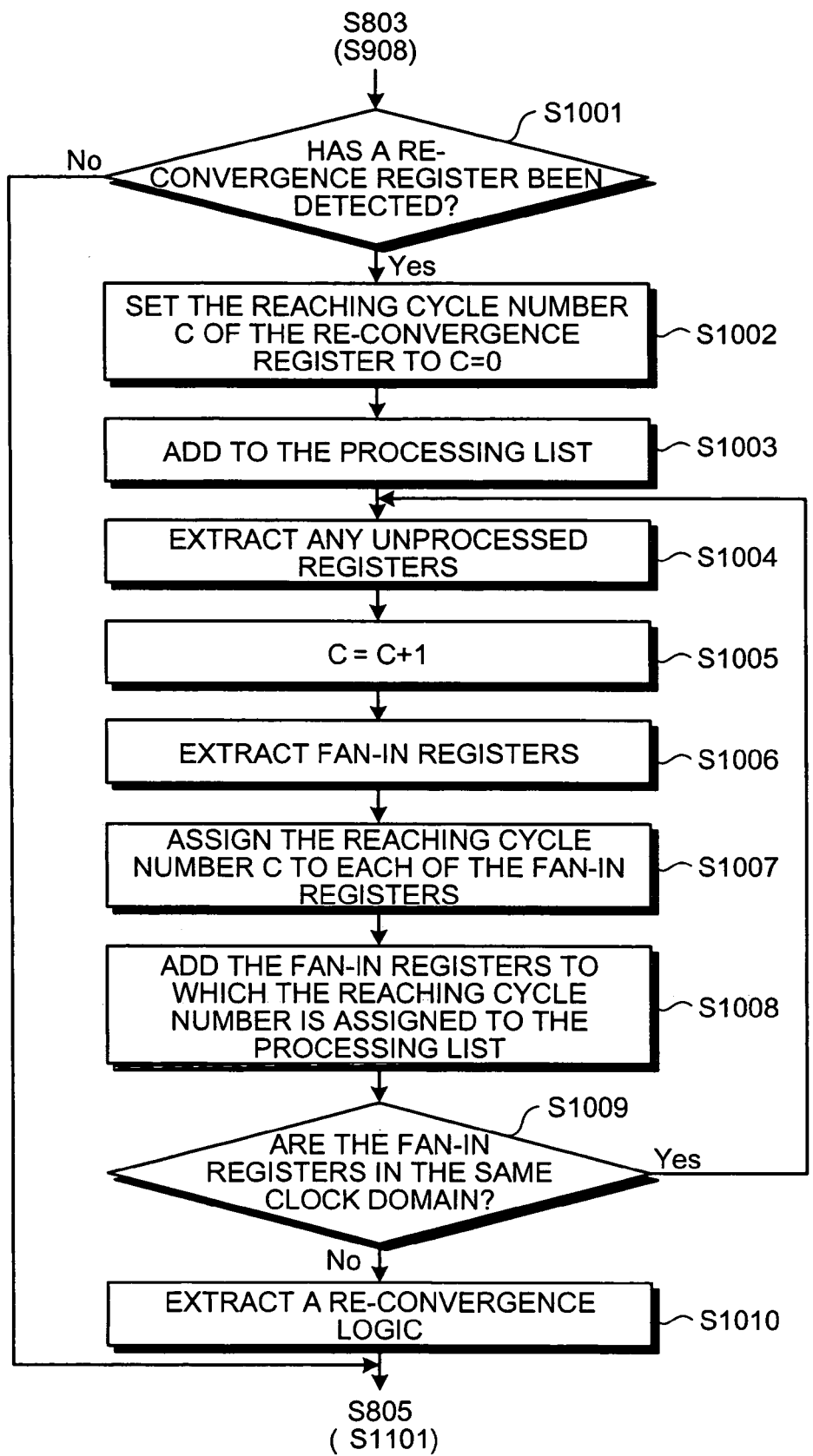
FIG. 10 is a flowchart of a re-convergence logic extraction process illustrated in FIG. 8.

FIG. 10 is a flowchart of the re-convergence logic extraction process illustrated in FIG. 8. As shown in FIG. 10, if a re-convergence register is detected at step S803 (Yes at step S1001), the reaching cycle number C of the re-convergence register is set to C=0 (step S1002), and the re-convergence register is added to the processing list in the extraction unit 304 (step S1003). For example, if the register R8 is detected as a re-convergence register at step S804, the reaching cycle number C of the register R8 is set to C=0, and the register R8 is added to the processing list.

Subsequently, one or more unprocessed registers are extracted from the processing list (step S1004), and the reaching cycle number C of each of the extracted unprocessed registers is incremented by 1 (step S1005). A fan-in register of each of the extracted registers is extracted (step S1006). The reaching cycle number C after incrementing at step S1005 is assigned to each of the fan-in registers (step S1007), and the fan-in registers are added to the processing list (step S1008).

For example, the re-convergence register (i.e. the register R8), whose reaching cycle number C is set to C=0 is extracted as an unprocessed register at step S1004, the reaching cycle number C of the register R8 is incremented by 1. Subsequently, the registers R3 and R7, which are fan-in registers of the register R8, are extracted, and the reaching cycle number C that has-been incremented is assigned to each of the registers R3 and R7. The registers R3 and R7 with the reaching cycle number assigned are added to the processing list as unprocessed registers.

As another example, at step S1009, if the fan-in registers extracted at step S1006 are in the same clock domain as the register extracted at step S1004 (Yes at step S1009), the procedure returns to step S1004, where one or more unprocessed registers are extracted from the processing list. Conversely, if the fan-in registers are in a clock domain that is different from the register extracted at step S1004 (No at step S1009), a re-convergence logic is extracted (step S1010). In other words, a logic that is constituted with the registers added to the processing list is extracted as a re-convergence logic.

For example, in FIG. 5, because the register R2 is a fan-in register of the register R3, a reaching cycle number C (C=2), which is obtained by incrementing the reaching cycle number C (C=1) of the register R3 by 1, is assigned to the register R2, and the register R2 is added to the processing list. Because the register R1 is a fan-in register of the register R2, a reaching cycle number C (C=3), which is obtained by incrementing the reaching cycle number C (C=2) of the register R2 by 1, is assigned to the register R1, and the register R1 is added to the processing list.

Similarly, because the register R6 is a fan-in register of the register R7, a reaching cycle number C (C=2), which is obtained by incrementing the reaching cycle number C (C=1) of the register R7 by 1, is assigned to the register R6, and the register R6 is added to the processing list. Because the register R5 is a fan-in register of the register R6, a reaching cycle number C (C=3), which is obtained by incrementing the reaching cycle number C (C=2) of the register R6 by 1, is assigned to the register R5, and the register R5 is added to the processing list.

For example, if there are no unprocessed registers at step S1010, the registers R1 to R3 and R5 to R8 are registered in the processing list. Consequently, a logic constituted with these registers, namely the registers R1 to R3 and R5 to R8, is used as the re-convergence logic 500.

Figure 11:
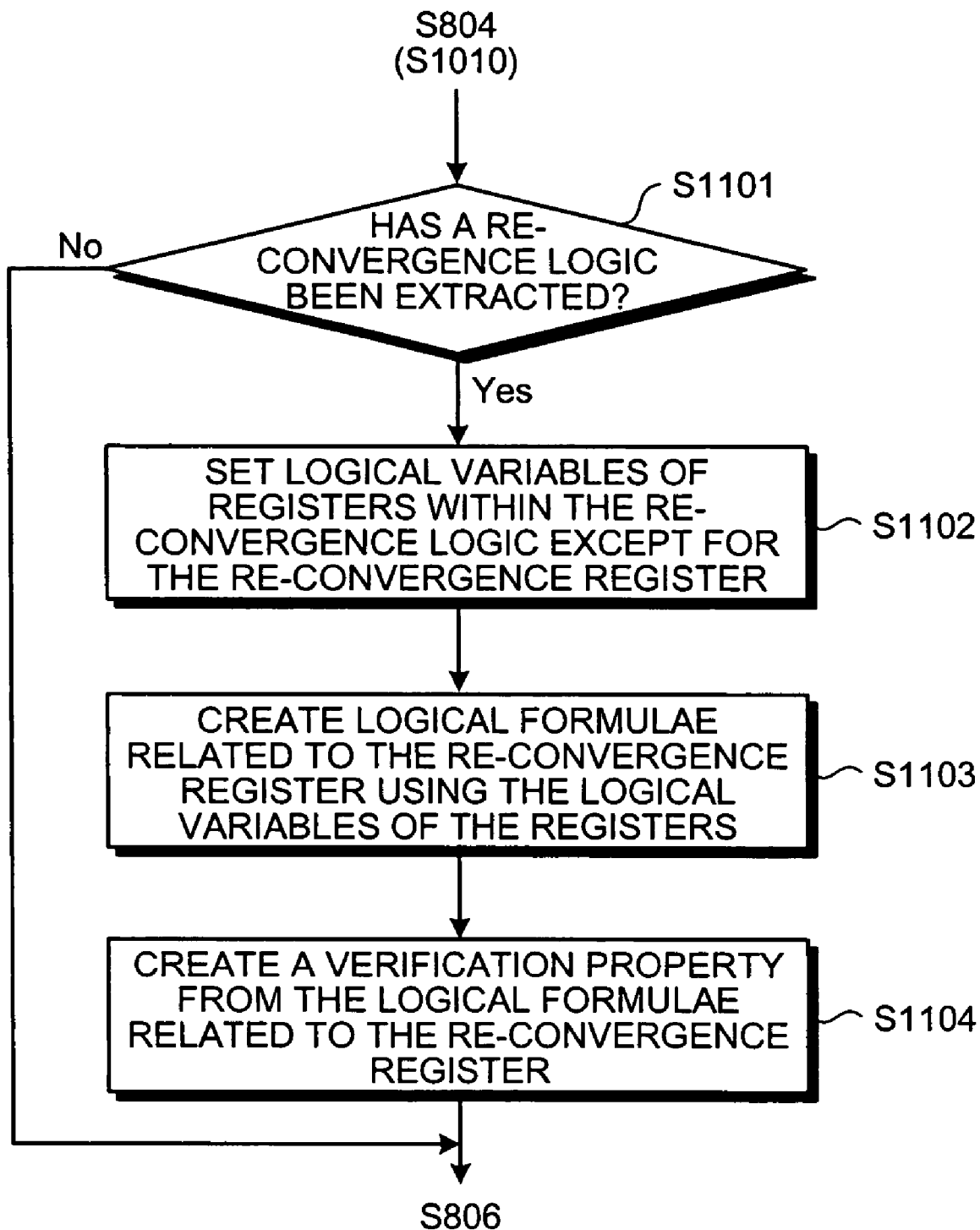
FIG. 11 is a flowchart of a verification property creation process illustrated in FIG. 8.

FIG. 11 is a flowchart of the verification property creation process illustrated in FIG. 8. As shown in FIG. 11, if a re-convergence logic is extracted at step S804 (Yes at step S1101), logical variables of the registers within the re-convergence logic except for the re-convergence register are set (step S1102).

Subsequently, logical formulae related to the re-convergence register are created using the logical variables of the registers (step S1103). The verification property 306 for verifying the re-convergence register is then created using the logical formula related to the re-convergence register (step S1104).

For example, if the re-convergence logic 500 shown in FIG. 5 is extracted as a re-convergence logic, the logical variables of the registers (namely R1 to R3 and R5 to R8) within the re-convergence logic 500, except for the re-convergence register (i.e. the register R8), are set (See the formulae (4) to (9) above). The logical formulae (10) to (15) related to the re-convergence register (i.e. the register R8) are created using the logical variables calculated in (4) to (9). The verification properties 306 shown as (18) and (19) for verifying the re-convergence register (i.e. the register R8) are created using the logical formulae (10) to (15), and the logical formulae (16) and (17).

As explained above, according to the present embodiment, it is possible to check registers by using only the logic up to the clock domains, out of the fan-in side logic that constitutes an observation signal. Consequently, it is possible to automatically create the verification property 306 for checking if metastability occurs in the operation whose value is not consistent with an expected value, that is the logic up to the clock domains constituting the observation signal.

Thus, according to present invention, it is possible to automatically detect in clock domains, a location at which a problem due to metastability occurs without manual labor, even if there are a large number of clock domains in an asynchronous multi-clock logical circuit. Consequently, there is an advantage that the workload of designers and the design time reduces.

The verification support method described in the present embodiment may be realized by executing a program prepared in advance, on a computer such as a personal computer or a workstation. Such a program is recorded on a computer-readable recording medium such as a hard disk, a flexible disc, a CD-ROM, an MO, and a DVD, and is read from the recording medium and then executed by a computer. Also, such a program may be a transferable medium that can be distributed via a network such as the Internet.

According to the present invention, it is possible to reduce the workload of designers, and shorten design time.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A verification support apparatus that verifies an object, the object including a plurality of clock domains, each clock domain including a plurality of registers, the verification support apparatus comprising:
   an input receiving unit that receives logical circuit description information on the object;
   a specifying unit that specifies at least two registers in one clock domain that output data to an adjacent clock domain;
   a detecting unit that detects, based on the logical circuit description information and specified registers, a re-convergence register in the adjacent clock domain that achieves convergence;
   an extracting unit that extracts a re-convergence logic starting from the re-convergence register up the specified registers; and
   a creating unit that creates, based on extracted re-convergence logic, a property for checking if the value of the re-convergence register is obtained correctly as 1 or 0.

2. The verification support apparatus according to claim 1, wherein
   the detecting unit detects the re-convergence register by following a fan-out side logic, starting from the specified registers.

3. The verification support apparatus according to claim 1, wherein
   the re-convergence logic includes a fan-in destination register and the re-convergence register, and
   the extracting unit extracts the re-convergence logic by following a fan-in side logic starting from the re-convergence register up to the specified registers.

4. The verification support apparatus according to claim 1, wherein
   the re-convergence logic includes a fan-in destination register and the re-convergence register,
   the extracting unit extracts the re-convergence logic by following the fan-in side logic starting from the re-convergence register up to the specified registers, and by appending a reaching cycle number of the re-convergence register to the fan-in destination register, and
   the creating unit creates the property using appended reaching cycle number.

5. A method for verifying an object, the object including a plurality of clock domains, each clock domain including a plurality of registers, the method comprising:
   receiving logical circuit description information on the object;
   specifying at least two registers in one clock domain that output data to an adjacent clock domain;
   detecting, based on the logical circuit description information and specified registers, a re-convergence register in the adjacent clock domain that achieves convergence;
   extracting a re-convergence logic starting from the re-convergence register up the specified registers; and
   creating, based on extracted re-convergence logic, a property for checking if the value of the re-convergence register is obtained correctly as 1 or 0.

6. The method according to claim 5, wherein
   the detecting includes detecting the re-convergence register by following a fan-out side logic, starting from the specified registers.

7. The method according to claim 5, wherein
   the re-convergence logic includes a fan-in destination register and the re-convergence register, and
   the extracting includes extracting the re-convergence logic by following a fan-in side logic starting from the re-convergence register up to the specified registers.

8. The method according to claim 5, wherein
   the re-convergence logic includes a fan-in destination register and the re-convergence register,
   the extracting includes extracting the re-convergence logic by following the fan-in side logic starting from the re-convergence register up to the specified registers, and by appending a reaching cycle number of the re-convergence register to the fan-in destination register, and the creating includes creating the property using appended reaching cycle number.

9. A computer-readable recording medium that records thereon a computer program implements a method for verifying an object on a computer, the object including a plurality of clock domains, each clock domain including a plurality of registers, and the computer program causes the computer to execute:

receiving logical circuit description information on the object;

specifying at least two registers in one clock domain that output data to an adjacent clock domain;

detecting, based on the logical circuit description information and specified registers, a re-convergence register in the adjacent clock domain that achieves convergence;

extracting a re-convergence logic starting from the re-convergence register up the specified registers; and creating, based on extracted re-convergence logic, a property for checking if the value of the re-convergence register is obtained correctly as 1 or 0.

10. The recording medium according to claim 9, wherein the detecting includes detecting the re-convergence register by following a fan-out side logic, starting from the specified registers.

11. The recording medium according to claim 9, wherein the re-convergence logic includes a fan-in destination register and the re-convergence register, and the extracting includes extracting the re-convergence logic by following a fan-in side logic starting from the re-convergence register up to the specified registers.

12. The recording medium according to claim 9, wherein the re-convergence logic includes a fan-in destination register and the re-convergence register, the extracting includes extracting the re-convergence logic by following the fan-in side logic starting from the re-convergence register up to the specified registers, and by appending a reaching cycle number of the re-convergence register to the fan-in destination register, and the creating includes creating the property using appended reaching cycle number.

\* \* \* \* \*